(12) United States Patent
Hu et al.

(10) Patent No.: US 11,069,390 B2
(45) Date of Patent: Jul. 20, 2021

(54) SPIN-ORBIT TORQUE MAGNETORESISTIVE RANDOM ACCESS MEMORY WITH MAGNETIC FIELD-FREE CURRENT-INDUCED PERPENDICULAR MAGNETIZATION REVERSAL

(71) Applicant: Wisconsin Alumni Research Foundation, Madison, WI (US)

(72) Inventors: Jiamian Hu, Middleton, WI (US); Minyi Dai, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 16/562,538

(22) Filed: Sep. 6, 2019

(65) Prior Publication Data
US 2021/0074344 A1    Mar. 11, 2021

(51) Int. Cl.
| | | |
|---|---|---|
| *G11C 11/16* | (2006.01) | |
| *H01F 10/32* | (2006.01) | |
| *H01L 43/10* | (2006.01) | |
| *H01L 27/22* | (2006.01) | |
| *H01L 43/02* | (2006.01) | |

(52) U.S. Cl.
CPC ........ *G11C 11/1675* (2013.01); *G11C 11/161* (2013.01); *G11C 11/1673* (2013.01); *H01F 10/329* (2013.01); *H01F 10/3281* (2013.01); *H01F 10/3286* (2013.01); *H01L 27/228* (2013.01); *H01L 43/02* (2013.01); *H01L 43/10* (2013.01); *G11C 11/1659* (2013.01)

(58) Field of Classification Search
CPC .................................................. G11C 11/161

USPC .......................................................... 365/158
See application file for complete search history.

(56) References Cited

U.S. PATENT DOCUMENTS

| | | | | |
|---|---|---|---|---|
| 2017/0117323 A1* | 4/2017 | Braganca | ................ | H01L 43/08 |
| 2017/0222135 A1* | 8/2017 | Fukami | ................ | H01L 27/105 |
| 2018/0240966 A1* | 8/2018 | Mihajlovic | ............ | H01L 43/08 |
| 2020/0020374 A1* | 1/2020 | Yoda | ..................... | G11C 11/161 |
| 2020/0043538 A1* | 2/2020 | Mihajlovic | .......... | H01L 27/226 |
| 2020/0075073 A1* | 3/2020 | Sasaki | .................... | H01L 43/14 |

(Continued)

OTHER PUBLICATIONS

Yu et al., Switching of perpendicular magnetization by spin-orbit torques in the absence of external magnetic fields, Nature Nanotechnology, Published Online May 11, 2014, pp. 1-7.

(Continued)

*Primary Examiner* — Min Huang
(74) *Attorney, Agent, or Firm* — Bell & Manning, LLC; Michelle Manning

(57) ABSTRACT

Spin-orbit torque magnetoresistive random-access memory (SOT-MRAM) cells that undergo perpendicular magnetization switching in the absence of an in-plane magnetic field and methods for their operation are provided. The SOT-MRAM cells use cobalt-iron-boron alloys, cobalt-iron alloys, metallic cobalt, and/or metallic iron as the ferromagnetic free layer in a magnetic tunnel junction. By designing the ferromagnetic layer with appropriate lateral dimensions and operating the SOT-MRAM cells with an appropriate charge current density, deterministic perpendicular magnetization switching is achieved without the need to apply an external in-plane bias collinear with the charge current.

25 Claims, 15 Drawing Sheets

(56) References Cited

U.S. PATENT DOCUMENTS

2020/0235289 A1* 7/2020 Alam .................... G11C 11/161

OTHER PUBLICATIONS

Chen et al., Field-free spin-orbit torque switching of a perpendicular ferromagnet with Dzyaloshinskii-Moriya interaction, Appl. Phys. Lett. 114, 022401 (2019); https://doi.org/10.1063/1.5052194 Submitted: Aug. 14, 2018 . Accepted: Dec. 22, 2018 . Published Online: Jan. 15, 2019.

Li et al., Magnetization dynamics modulated by Dzyaloshinskii-Moriya interaction in the double-interface spin transfer torque magnetic tunnel junction, Nanoscale Res Lett 14, 315 (2019) doi:10.1186/s11671-019-3150-4.

Wu et al., Deterministic Field-free Switching of a Perpendicularly Magnetized Ferromagnetic Layer via the Joint Effects of Dzyaloshinskii-Moriya Interaction and Field-like Spin-orbit Torque: an Appraisal, eprint arXiv:1903.09702, Mar. 2019.

Ma et al., Interfacial Control of Dzyaloshinskii-Moriya Interaction in Heavy Metal/Ferromagnetic Metal Thin Film Heterostructures, Phys. Rev. B 94, 180408(R)—Published Nov. 28, 2016.

Perez et al., Chiral magnetization textures stabilized by the Dzyaloshinskii-Moriya interaction during spin-orbit torque switching, Appl. Phys. Lett. 104, 092403 (2014); https://doi.org/10.1063/1.4867199.

Wang et al., Field-free switching of perpendicular magnetic tunnel junction by the interplay of spin orbit and spin transfer torques, eprint arXiv:1806.06174, Jun. 2018.

Wang et al., Field-free switching of a perpendicular magnetic tunnel junction through the interplay of spin-orbit and spin-transfer torques Nat Electron 1, 582-588 (2018) doi:10.1038/s41928-018-0160-7, Published: Nov. 12, 2018.

Ma et al., Switching a Perpendicular Ferromagnetic Layer by Competing Spin Currents, Phys. Rev. Lett. 120, 117703—Published Mar. 16, 2018.

Wu et al., Néel-type skyrmion in WTe2/Fe3GeTe2 van der Waals heterostructure, eprint arXiv:1907.11349, Jul. 2019.

Wang et al., Strain-mediated spin-orbit torque switching for magnetic memory, Phys. Rev. Applied 10, 034052—Published Sep. 25, 2018.

Sakimura et al., MRAM Cell Technology for Over 500-MHz SoC, IEEE Journal of Solid-State Circuits, vol. 42, No. 4, Apr. 2007, pp. 830-838, DOI: 10.1109/JSSC.2007.891665, Date of Publication: Mar. 26, 2007.

Yu et al., Current-driven perpendicular magnetization switching in Ta/CoFeB/[TaOx or MgO/TaOx] films with lateral structural asymmetry, Applied Physics Letters 105, 102411 (2014); doi: 10.1063/1.4895735, Published Online: Sep. 12, 2014.

Chen et al., The current-induced spin-orbit torque and field-free switching from Mo-based magnetic heterostructures, Physical Review Applied, vol. 10, Issue 4, id.044038, Oct. 2018, doi: 10.1103/PhysRevApplied.10.044038.

Zhao et al., External-Field-Free Spin Hall Switching of Perpendicular Magnetic Nanopillar with a Dipole-Coupled Composite Structure, eprint arXiv:1603.09624, Feb. 2016.

Fukami et al., Magnetization switching by spin-orbit torque in an antiferromagnet/ferromagnet bilayer system, Nature Mater 15, 535-541 (2016) doi:10.1038/nmat4566, Published: Feb. 15, 2016.

Cai et al., Electric field control of deterministic current-induced magnetization switching in a hybrid ferromagnetic/ferroelectric structure, Nature Mater 16, 712-716 (2017) doi:10.1038/nmat4886, Published: Apr. 3, 2017.

Fukami et al., A spin-orbit torque switching scheme with collinear magnetic easy axis and current configuration, Nature Nanotech 11, 621-625 (2016) doi:10.1038/nnano.2016.29, Published: Mar. 21, 2016.

Fukami, et al., A sub-ns three-terminal spin-orbit torque induced switching device, Published in: 2016 IEEE Symposium on VLSI Technology, Date of Conference: Jun. 14-16, 2016, Date Added to IEEE Xplore: Sep. 22, 2016, Publisher: IEEE, DOI: 10.1109/VLSIT.2016.7573379.

Lau et al., Spin-orbit torque switching without an external field using interlayer exchange coupling. Nature Nanotech 11, 758-762 (2016) doi:10.1038/nnano.2016.84, Published: May 30, 2016.

* cited by examiner

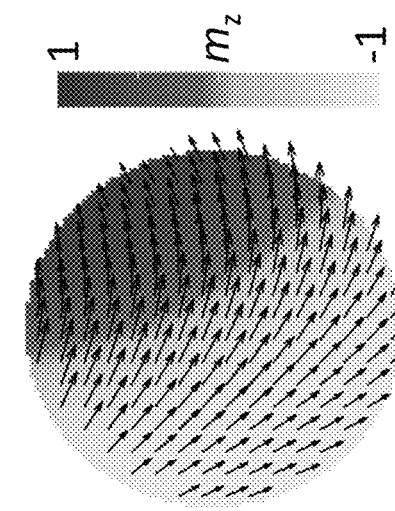
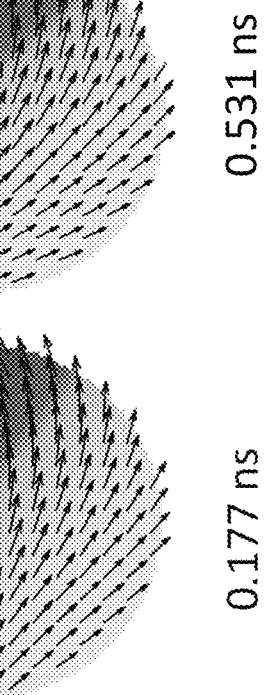
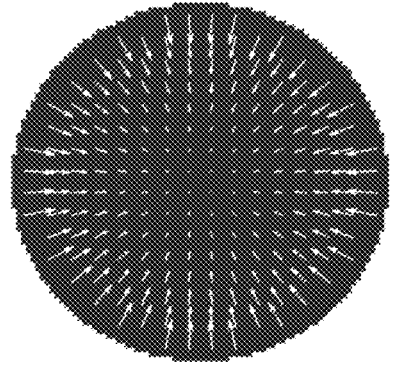
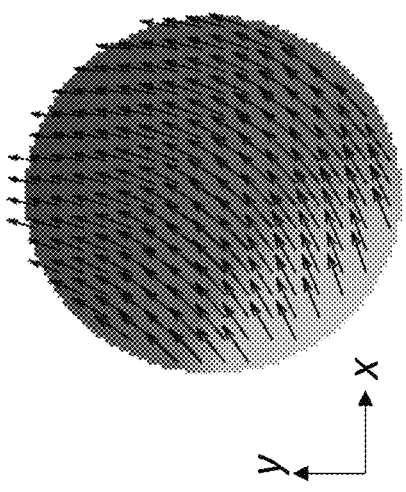
FIG. 4A
FIG. 4B 0.354 ns 0.142 ns 0.071 ns

SPIN-ORBIT TORQUE MAGNETORESISTIVE RANDOM ACCESS MEMORY WITH MAGNETIC FIELD-FREE CURRENT-INDUCED PERPENDICULAR MAGNETIZATION REVERSAL

BACKGROUND

Magnetization reversal through spin-orbit torque (SOT) is of great interest due to its potential applications in spin-orbit torque magnetoresistive random access memory (SOT-MRAM), which promises faster write speeds and lower write energies than spin-transfer-torque (STT) MRAM. Current-induced SOT has been used to switch both the perpendicular and in-planar magnetization in the free layers of magnetic tunnel junctions (MTJs), but perpendicular magnetization switching is more attractive for SOT-MRAM applications because it is faster and because a perpendicularly magnetized free layer is easier to downscale for realizing higher storage density. Unfortunately, SOT-mediated perpendicular magnetization reversal typically requires a simultaneous application of an in-plane bias magnetic field, which can severely impede the development of high-density SOT-MRAM, because it can cause cross-talk between neighboring MTJs.

To address this limitation, various approaches have been proposed to realize field-free SOT-mediated perpendicular magnetization reversal. An early proposed approach is to fabricate asymmetric multilayer stacks by, for example, engineering a thickness gradient into a ferromagnetic free layer or its overlaying barrier oxide in an MTJ. Alternatively, it has been proposed to engineer a thickness gradient into the heavy metal (HM) spin-Hall layer underlying the ferromagnetic material. Such structural asymmetry in effect generates a perpendicular magnetic field for facilitating a deterministic reversal. Other approaches that have been proposed include utilizing an in-plane magnetized ferromagnetic reference layer in the MTJ or replacing the non-magnetic HM layer with an antiferromagnetic HM with in-plane magnetized sublattices (such as PtMn). Both approaches aim to introduce a built-in in-plane bias magnetic field, rather than applying one externally. Several other approaches have been proposed, including the integration of a ferroelectric layer beneath the HM layer to harness the effect of polarization charges or the piezoelectric strain, adding another HM layer to generate competing spin currents, or exploiting the assistance from the STT by simultaneously applying an out-of-plane electric current from the top of the MTJ. Most recently, micromagnetic simulations have suggested that field-free SOT-induced perpendicular magnetization reversal may be achieved in a ferromagnetic nanodisk due to the Dyzaloshinskii-Moriya interaction (DMI) at the interface of the ferromagnetic layer and an underlying heavy metal layer when certain magnitudes of the driving in-plane current are utilized. However, no material-specific investigations of field-free perpendicular magnetization switching based on DMI have been reported, and the limitations imposed on such switching by the lateral dimensions of a ferromagnetic free layer have not been investigated.

SUMMARY

SOT-MRAM cells that undergo perpendicular magnetization switching in the absence of an in-plane magnetic field and methods for their operation are provided.

One embodiment of a spin-orbit torque magnetoresistive random-access memory cell includes: a structurally symmetric circular magnetic tunnel junction; a structurally symmetric spin current layer comprising a non-magnetic material; a write line in electrical communication with the spin current layer; and a read line in electrical communication with the magnetic tunnel junction. The magnetic tunnel junction includes: a free layer comprising CoFeB, CoFe, metallic cobalt, or metallic iron and having a perpendicular magnetic anisotropy; a pinned layer comprising a ferromagnetic material having a fixed perpendicular direction of magnetization; and a barrier layer comprising an electrically insulating material separating the free layer from the pinned layer. The spin current layer is in contact with the free magnetic layer of the magnetic tunnel junction at an interface.

The spin-orbit torque magnetoresistive random-access memory cell can be deterministically switched by: passing an in-plane write current through the spin current layer in the absence of a colinear in-plane magnetic field, whereby a perpendicular spin current is generated in the spin current layer, giving rise to a spin torque in the free magnetic layer that deterministically reverses the perpendicular magnetization of the free magnetic layer, wherein the perpendicular magnetization reversal is not strain-mediated; and passing a read current through the magnetic tunnel junction and measuring the resistance of the magnetic tunnel junction.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIGS. 4A-4B depict top-view magnetization distributions of the $Co_{20}Fe_{60}B_{20}$ disk in the SOT-MRAIVI cell at the initial state 0 ns (FIG. 4A) and later time stages (FIG. 4B), under a time-invariant charge current $J=1.4\times10^{13}$ A/m². For clarity, the arrows are shown in white in FIG. 4A and in black in FIG. 4B.

DETAILED DESCRIPTION

Figure 1A:
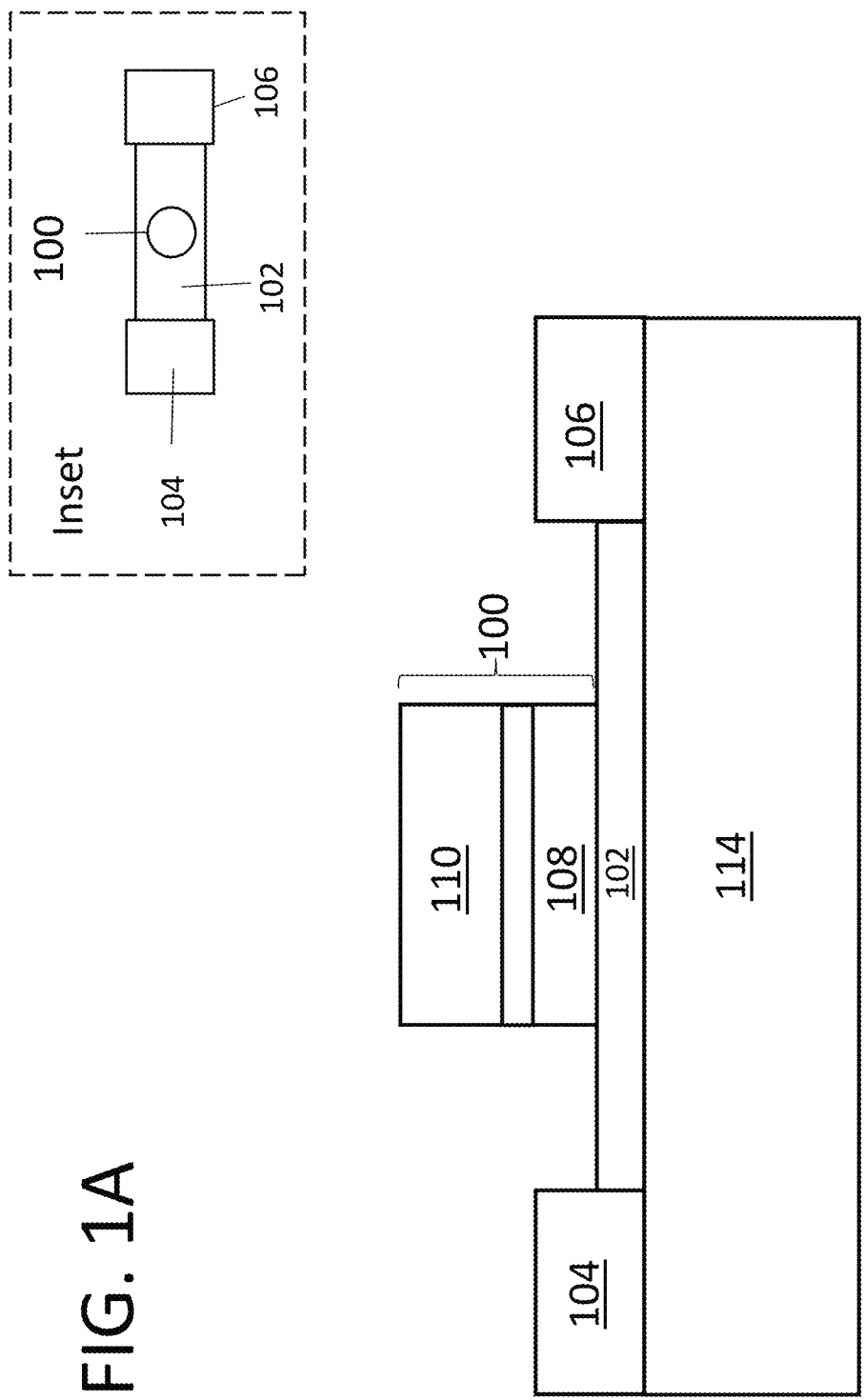
FIG. 1A shows a cross-sectional side view of an SOT-MRAM cell.

SOT-MRAM cells that undergo perpendicular magnetization switching in the absence of an in-plane magnetic field and methods for their operation are provided. The SOT-MRAM cells use cobalt-iron-boron (CoFeB) alloys, cobalt-iron alloys (CoFe), metallic cobalt (Co), or metallic iron (Fe) as the ferromagnetic free layer in a magnetic tunnel junction (MTJ). By designing the ferromagnetic layer with appropriate lateral dimensions and operating the SOT-MRAM cells with an appropriate charge current density, deterministic perpendicular magnetization switching can be achieved without the need to apply an external in-plane bias collinear with the charge current.

Various aspects of the inventions described herein are based, at least in part, on the inventors' discovery that CoFeB, CoFe, metallic iron, and metallic cobalt ferromagnetic free layers having certain lateral dimensions can provide deterministic perpendicular magnetization switching in an SOT-MRAM cell without the need to apply an external in-plane bias collinear with the charge current when the cells are operated with an appropriate charge current density. In the specified size and charge current density regimes, deterministic magnetization switching is promoted by the DMI at the interface between a CoFeB, CoFe, Co, or ferromagnetic layer and a non-magnetic layer. The DMI is an antisymmetric exchange interaction at the interface of the ferromagnetic material with the non-magnetic material (e.g., a heavy metal) due to a lack of inversion symmetry that promotes canted rather than parallel or anti-parallel spin alignments. In the SOT-MRAM cells described herein, the DMI induces magnetization asymmetry and enables field-free deterministic perpendicular magnetization switching, even in the absence of an applied in-plane magnetic field collinear with the SOT-inducing charge current.

Magnetic field-free perpendicular switching eliminates the need for an external or internal in-plane magnetic field source, thereby reducing the SOT-MRAM device dimensions and enabling higher storage densities. In addition, the elimination of the in-plane magnetic field eliminates crosstalk between neighboring MTJ units, which can limit SOT-MRAM performance.

The SOT-MRAM cells include an MTJ on a non-magnetic spin current layer and read and write lines configured to carry out the read and write operations of the cell. During the write operation, an in-plane charge current (a write current) flowing through the spin current layer is converted into a perpendicular spin current via the spin-Hall effect. This spin current is then transferred into the free layer of the MTJ, switching its perpendicular polarization via spin-orbit torque.

Unlike other SOT-MRAM cells that provide magnetic field-free perpendicular magnetization switching, the present SOT-MRAM cells are able to achieve perpendicular magnetization switching using structurally symmetric (e.g., thickness gradient-free) MTJ stacks and non-metallic spin current layers and without the need to introduce a built-in in-plane bias magnetic field. The present SOT-MRAM cells also do not rely upon the integration of a ferroelectric layer beneath the non-magnetic spin current layer to harness the effect of polarization charges or the piezoelectric strain, the addition of an extra HM layer to generate competing spin currents, or assistance from STT by the simultaneous application of an out-of-plane electric current from the top of the MTJ.

Figure 1B:
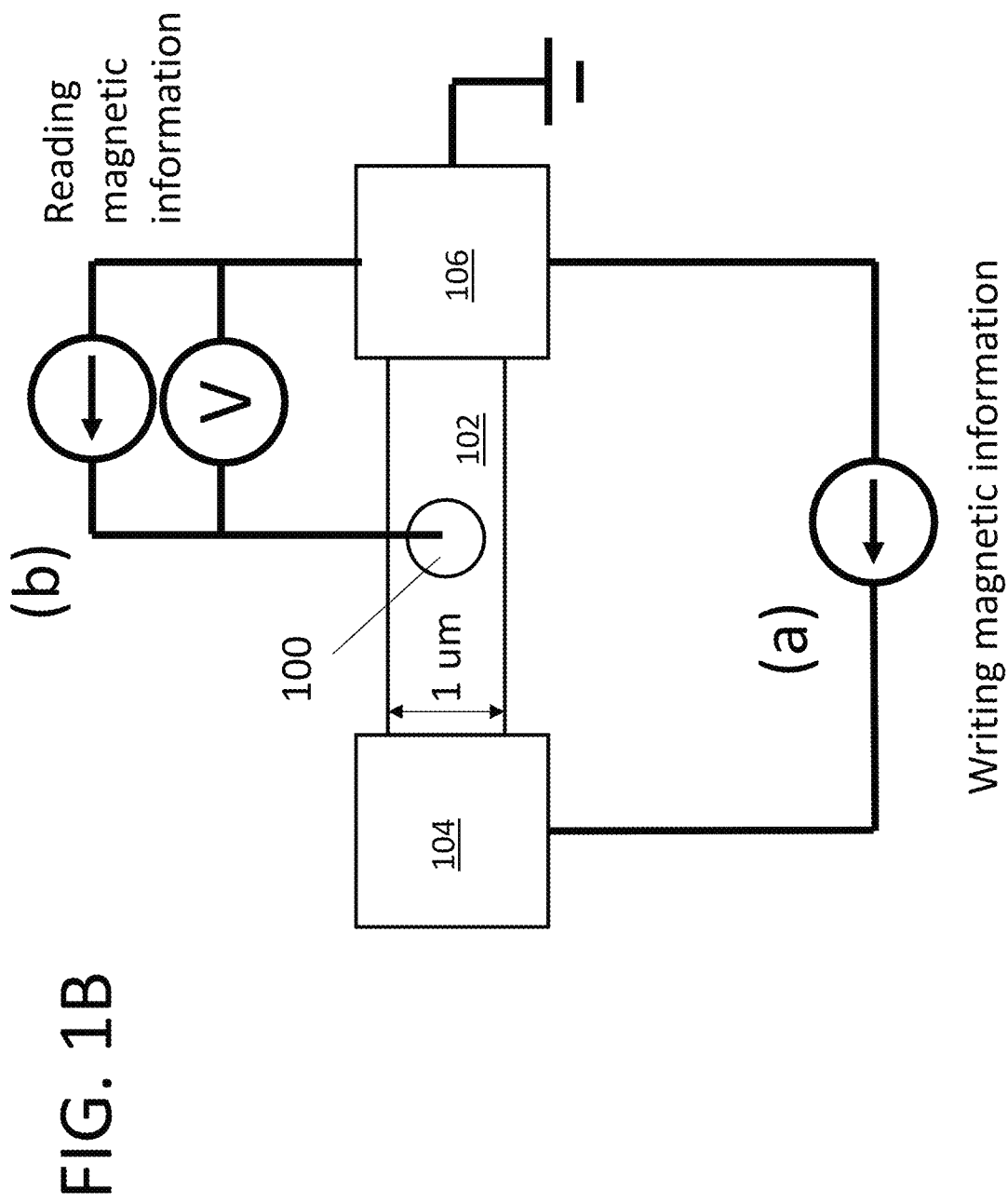
FIG. 1B shows a circuit configuration for the SOT-MRAM cell of FIG. 1A.

A schematic diagram showing a side-view of one embodiment of an SOT-MRAM cell is provided in FIG. 1A. A side view is provided in the inset. FIG. 1B shows a circuit configuration for the SOT-MRAM cell of FIG. 1A. This embodiment is a three terminal SOT-MRAM cell that includes MTJ 100 on a non-metallic spin current layer 102 having a perpendicular magnetic anisotropy. A first electrode 104 and a second electrode 106 are positioned in electrical communication (direct or indirect) with non-magnetic spin current layer 102, such that they are configured to pass an in-plane charge current through that layer, as illustrated in FIG. 1B. Electrodes 104 and 106 are formed from an electrically conductive material, typically a metal, such as gold, ruthenium, tantalum, or copper. The MTJ includes a lower CoFeB, CoFe, Co, or Fe ferromagnetic layer (the free layer) 108 interfaced with spin current layer 102, an upper ferromagnetic layer having a fixed perpendicular direction of magnetization (the pinned layer) 110, and a dielectric barrier layer 112 that serves as a tunnel barrier between lower and upper ferromagnetic layers 108, 110. Examples of suitable tunnel barrier materials include magnesium oxide and aluminum oxide. The structure can be grown on top of a growth substrate 114. A third electrode positioned in electrical communication (direct or indirect) with pinned layer 110 can be provided, such that the second and third electrodes are configured to pass read current through MTJ 100. MTJ 100 has a circular cross-section consistent with perpendicular magnetization switching.

In the SOT-MRAM of FIG. 1A, the MTJ layers, such as the free layer and the barrier layer, as well as the spin current layer, are structurally symmetric. As used herein, the term structurally symmetric means that these layers do not have a thickness gradient (e.g., a wedge shape) that generates a perpendicular magnetic field for facilitating a deterministic reversal.

The spin current layer is so called because it generates a perpendicular spin current (a separation and accumulation of oppositely polarized spins to the top and bottom Pt surfaces) when an in-plane charge current ($J_c$) is passed through it. This perpendicular spin current induces a spin torque on the magnetization of the ferromagnetic free layer. A variety of non-magnetic materials can be used as the free layer. These include heavy metals, such as platinum (Pt), tungsten (W), and tantalum (Ta), but also include topological materials, such as $Bi_{0.4}Se_{0.6}$ and $(Cr_{0.08}Bi_{0.54}Sb_{0.38})_2Te_3$, and 2D materials, such as $WTe_2$ and $MoS_2$.

Figure 5:
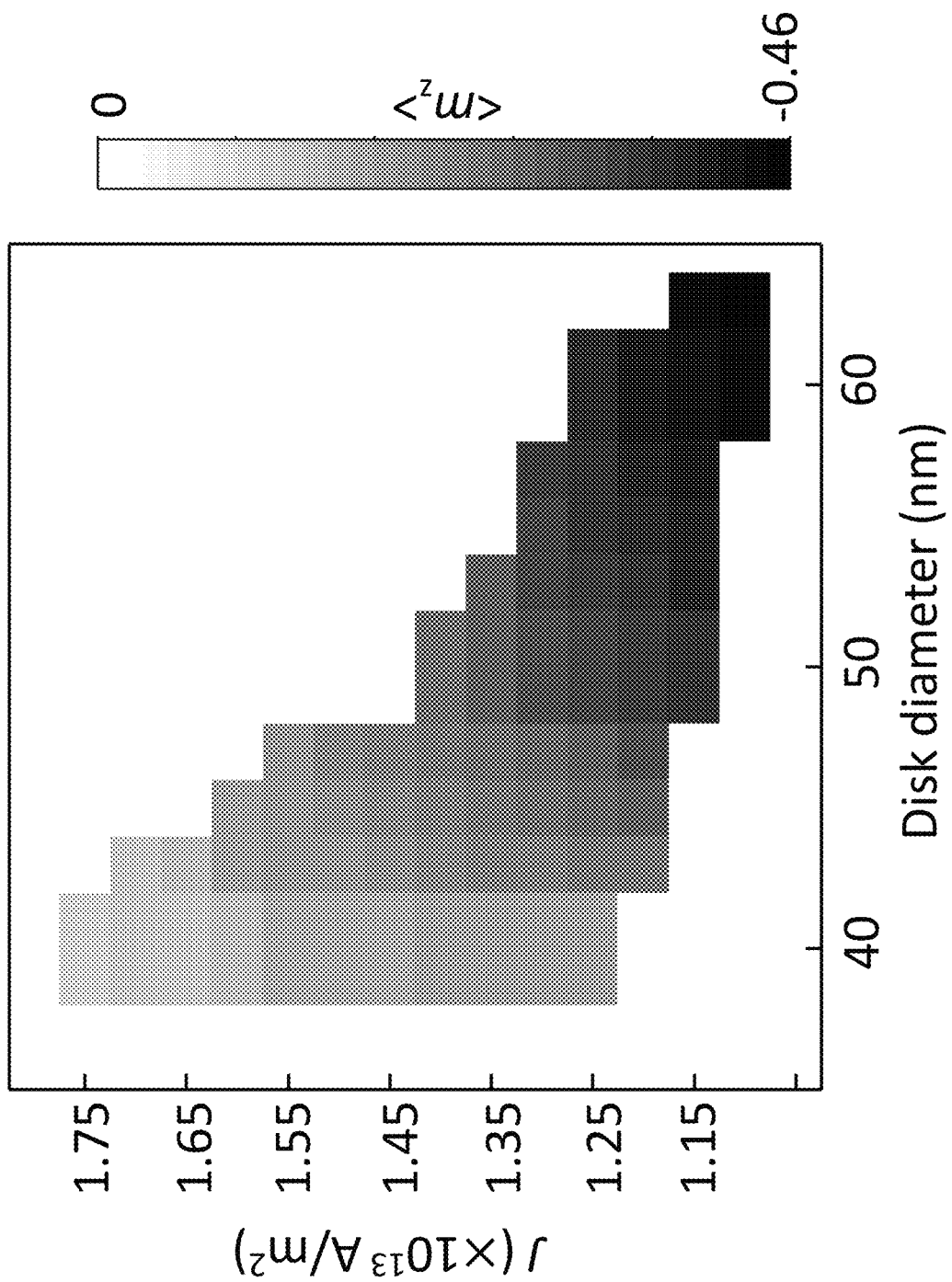
FIG. 5 depicts a map of equilibrated values of $<m_z>$ as a function of the diameter of the $Co_{20}Fe_{60}B_{20}$ disk and the magnitude of in-plane charge current Jc. Only negative values lower than −0.1 are shown, indicating the size and current range that permit a two-step reversal under a constant DMI strength of 0.45 mJ/m².
Figure 8:
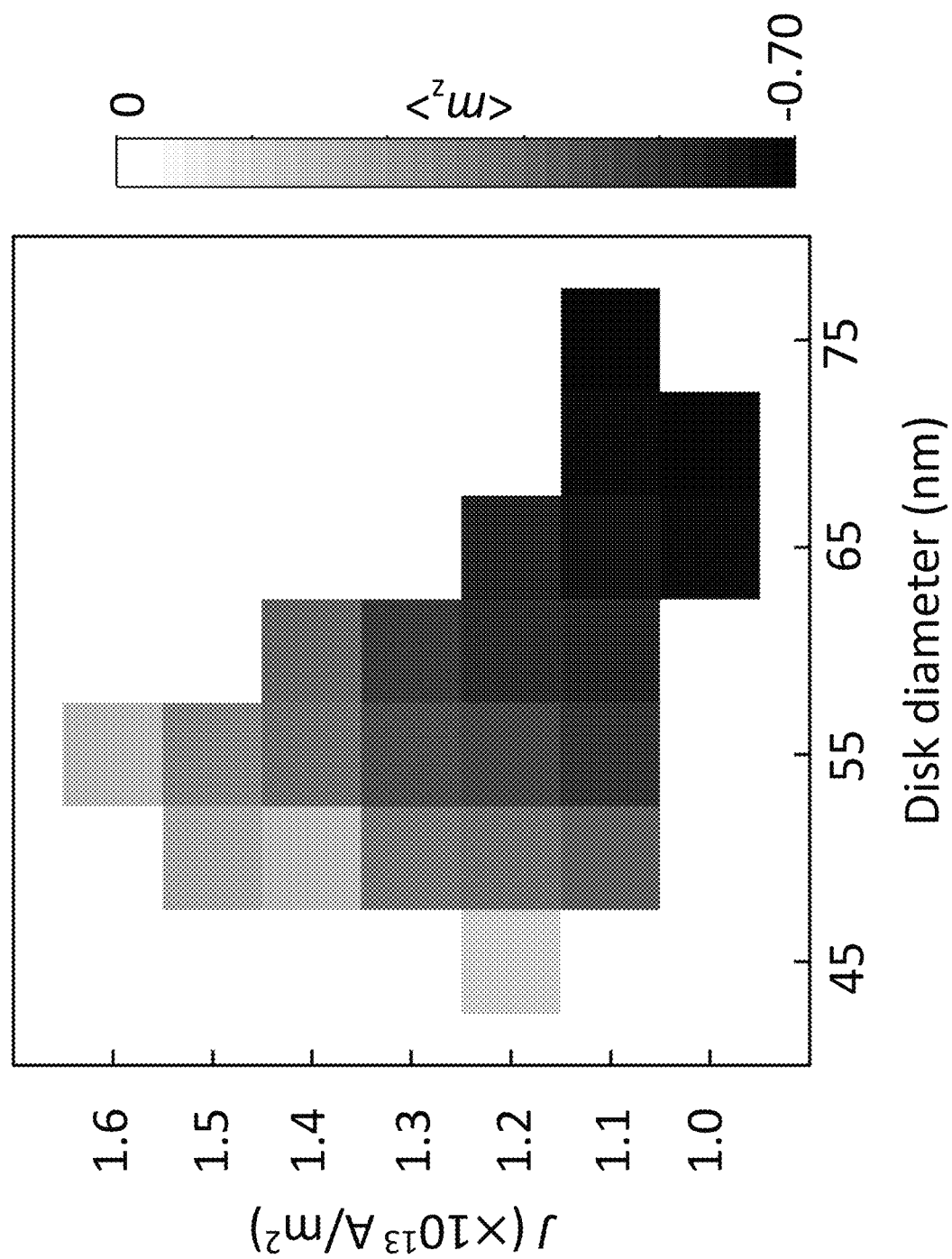
FIG. 8 depicts a map of equilibrated values of <$m_z$> as a function of the diameter of the Co disk and the magnitude of in-plane charge current Jc. Only negative values lower than −0.1 are shown, indicating the size and current range that permit a two-step reversal under a constant DMI strength of 2.05 mJ/m².

The DMI of the spin current layer/free layer interface and, therefore, the appropriate diameters (lateral dimensions) of the CoFeB, CoFe, Co, and Fe free layers will depend on the material used for the spin current layer. Appropriate diameters for the free layers include diameters of less than 80 nm, including diameters of less than 75 nm, and diameters of less than 60 nm. For example, various embodiments of the free layers have diameters in the range from 35 nm to 80 nm, including in the range from 40 nm to 75 nm. As illustrated in FIG. 5 and discussed in more detail in Example 1, for SOT-MRAM cells that use CoFeB as the free layer, free layers having a diameter in the range from 40 nm to 63 nm can be used. In some embodiments, the CoFeB free layer has a diameter of less than 60 nm. By way of illustration, in some embodiments the CoFeB free layer has a diameter in the range from 40 nm to 57 nm, and in some embodiments the CoFeB free layer has a diameter in the range from 40 nm to 50 nm. The composition of the CoFeB free layer can be represented by the formula $Co_xFe_yB_z$, where x+y+z=100, where x is typically in the range from about 20 to about 40, y is typically in the range from about 40 to about 60, and z is typically about 20. Similarly, as illustrated in FIG. 8 and discussed in more detail in Example 2, for SOT-MRAM cells that use cobalt as the free layer, free layers having a diameter in the range from 45 nm to 75 nm can be used. The significance of the above-recited size ranges for the CoFeB SOT-MRAM and the Co SOT-MRAM is illustrated in the Examples.

Pinned layer 110 is typically composed of the same ferromagnetic material as free layer 108. Therefore, if the free layer is CoFeB, the pinned layer can also be CoFeB; if the free layer is CoFe, the pinned layer can also be CoFe; if the free layer is cobalt, the pinned layer can also be cobalt; and if the free layer iron, the pinned layer is also iron. However, different ferromagnetic materials can be used for the pinned layers, including Co, Fe, CoFe and CoFeB.

The material layers making up the SOT-MRAM cells, including the spin current layer and the MTJ layers, are desirably very thin in order to allow memory devices made from the cells to be scaled down and to reduce energy consumption. By way of illustration, the spin current layer, the free layer, the barrier layer, and the pinned layer can each have thicknesses of 10 nm or less, including thicknesses in the range from 0.5 nm to 5 nm.

In addition to the layers and components shown in the SOT-MRAM cell of FIGS. 1A and 1B, the cell can include other layers and components generally used in such devices to improve their performance. Examples of such layers include, but are not limited to, capping layers disposed over the exposed surfaces of the MTJ, spin current layer, or substrate to prevent or reduce the oxidation of the materials, and synthetic antiferromagnet trilayers (SAFs) for reducing stray external fields.

The cells can be used for a variety of spin-orbit torque-based switching applications, including logic and memory devices. In the basic operation of write operation in the SOT-MRAM cells, an in-plane charge current is passed through the spin current layer. This generates a perpendicular spin current in the CoFeB, CoFe, Fe, or Co via the spin-Hall effect, which is passed into the adjacent free layer of the MTJ. As a result, a spin-orbit torque is produced, which deterministically switches the direction of perpendicular magnetization in the free layer. The switching of the magnetization of the free layer modulates the resistance of the MTJ. Generally, the MTJ will be in a low resistance state when the magnetization of the free layer is aligned with the magnetization of the pinned layer. The SOT-MRAM cell can be read by measuring the resistance of the MTJ using a resistance measuring device. This can be done by, for example, sending a small sensing current to the tunnel junction to generate a sensing voltage, which can be detected (e.g., by a voltmeter) and used to measure the resistance, as illustrated in FIG. 1B.

Figure 2:
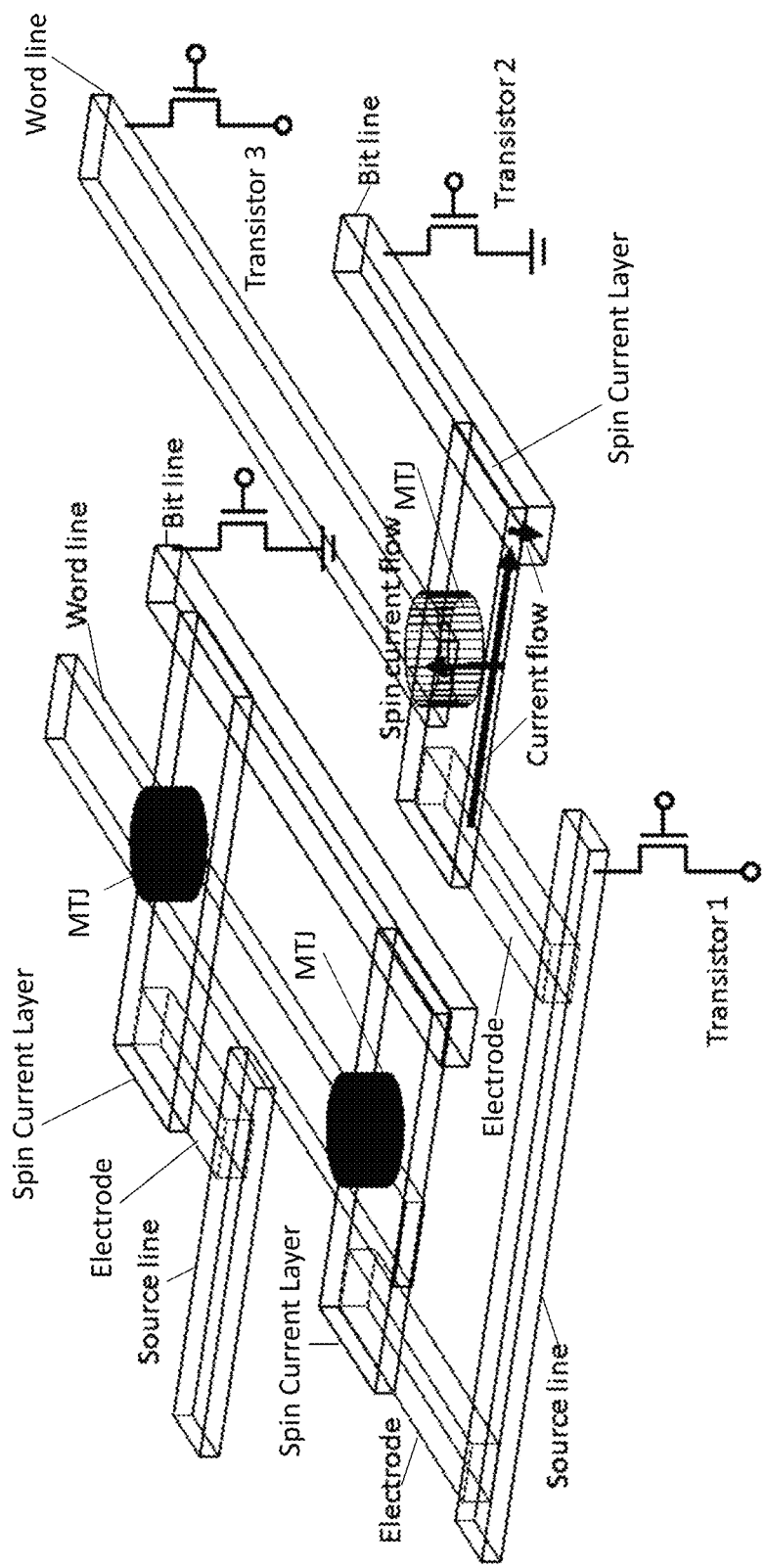
FIG. 2 shows a magnetic memory array constructed from a plurality of SOT-MRAM cells.

A magnetic memory device can be constructed by connecting a plurality of the SOT-MRAM cells in an array. One embodiment of such a memory array is shown schematically in FIG. 2. In the array, the MTJ cells and their respective spin current layers serve as memory elements, which are connected by a grid of source lines, bit lines, and word lines, with electrodes connecting the source lines to the spin current layers. The various lines and electrodes are made of electrically conductive materials, such as metals (e.g., Au, Cu, and the like). The array operates as follows: to write a target bit, transistors 1 and 2 on the bit's source line and bit line, respectively, are turned on to create a charge current flow into the target spin current layer. The source line sources a large charge current (which can be several milli-amps, depending on the critical current for magnetization switching). The charge current generates a perpendicular spin current in the MTJ and deterministically reverses the magnetization of the CoBeF, CoFe, Co, or Fe free layer in the MTJ. To read a target bit, transistors 2 and 3 on the bit's bit line and word line, respectively, are turned on. The word line sources a small current for detecting the resistance of the MTJ.

During the write operation, the magnitude of the density of the write current is carefully maintained at a magnitude that makes deterministic magnetization switching without the application of a collinear external or internal magnetic bias field possible. The write currents are low density currents—generally having a current density of below $2.00 \times 10^{13}$ A/m2, including below $1.80 \times 10^{13}$ A/m$^2$. For the SOT-MRAM cells that use a CoFeB alloy as the free layer in the MTJ, the write current density should be maintained below $1.75 \times 10^{13}$ A/m$^2$. This includes write current densities in the range from $1.75 \times 10^{13}$ A/m$^2$ to $1.10 \times 10^{13}$ A/m$^2$. For the SOT-MRAM cells that use a cobalt metal as the free layer in the MTJ, the write current density should be maintained below $1.60 \times 10^{13}$ A/m$^2$. This includes write current densities in the range from $1.60 \times 10^{13}$ A/m$^2$ to $1.00 \times 10^{13}$ A/m$^2$. The current densities recited herein correspond to upper limits on the current densities for the devices operating at or near room temperature (i.e., 20° C. to 25° C.; typically, 23° C.); however, due to thermal fluctuations, the write current densities may be lower.

The significance of the above-recited size ranges for the CoFeB SOT-MRAM and the Co SOT-MRAM is illustrated in the Examples.

EXAMPLES

Example 1

Field-Free Deterministic Switching in Pt/CoFeB/MgO

This example reveals the appropriate lateral dimension ranges and charge current densities for the enablement of magnetic field-free SOT-induced perpendicular magnetization reversal based on micromagnetic simulations implemented in an in-house package and confirmed using MuMax3 software. Using realistic materials parameters from documented experimental measurements, the simulations demonstrate that deterministic perpendicular magnetization switching can occur in a MgO/Co$_{20}$Fe$_{60}$B$_{20}$(1.1 nm)/Pt(>2 nm) circular multilayer stack where the MgO/Co$_{20}$Fe$_{60}$B$_{20}$ bilayer has a diameter of no greater than 63 nm.

The parameters used in the simulations are provided in Table 1.

TABLE 1

| Parameter | Value |
| --- | --- |
| Saturation Magnetization (M$_S$) | 1.21 × 10$^6$ A/m |
| Anisotropy Constant (K$_1$) | 1.18 × 10$^6$ J/m$^3$ |
| Exchange Constant (A) | 1.9 × 10$^{-11}$ J/m |
| DMI Constant (D) | 0.45 mJ/m$^2$ |
| Damping constant (α) | 0.027 |
| Simulation cell size (Δx, Δy, Δz) | (1 nm, 1 nm, 1 nm) |
| Time stepping (Δt) | 1.77 × 10$^{-14}$ s |

Analysis of the kinetic mechanism of such new concept SOT perpendicular reversal is provided, which is also understood by developing an analytical model by analogy to classical nucleation and growth theory. The influence of several key materials parameters (within experimentally accessible ranges) on the suited size range of the MgO/CoFeB bilayer disk is also examined.

Figure 3A:
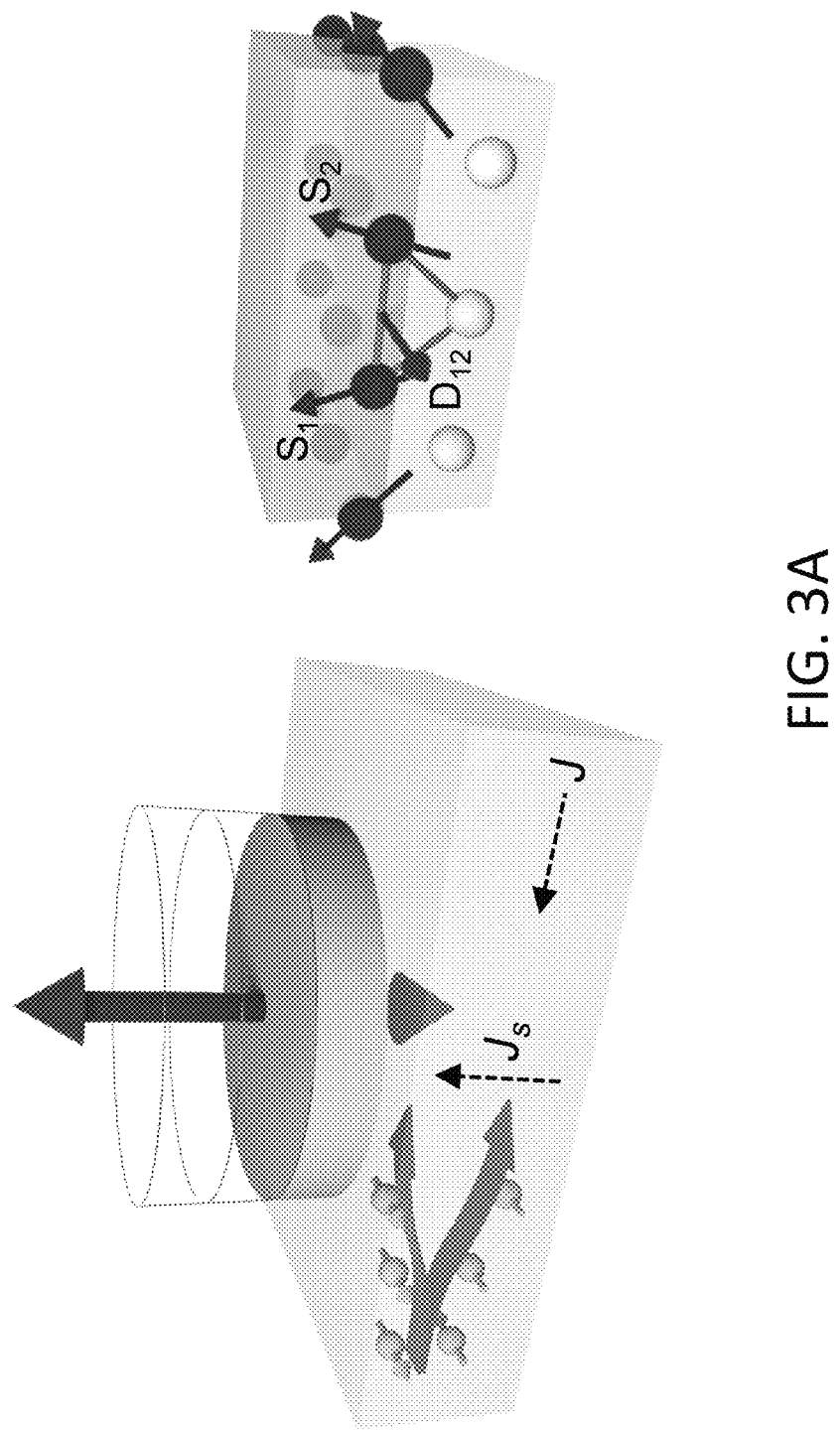
FIG. 3A depicts a schematic of an SOT-MRAM cell.
Figure 3B:
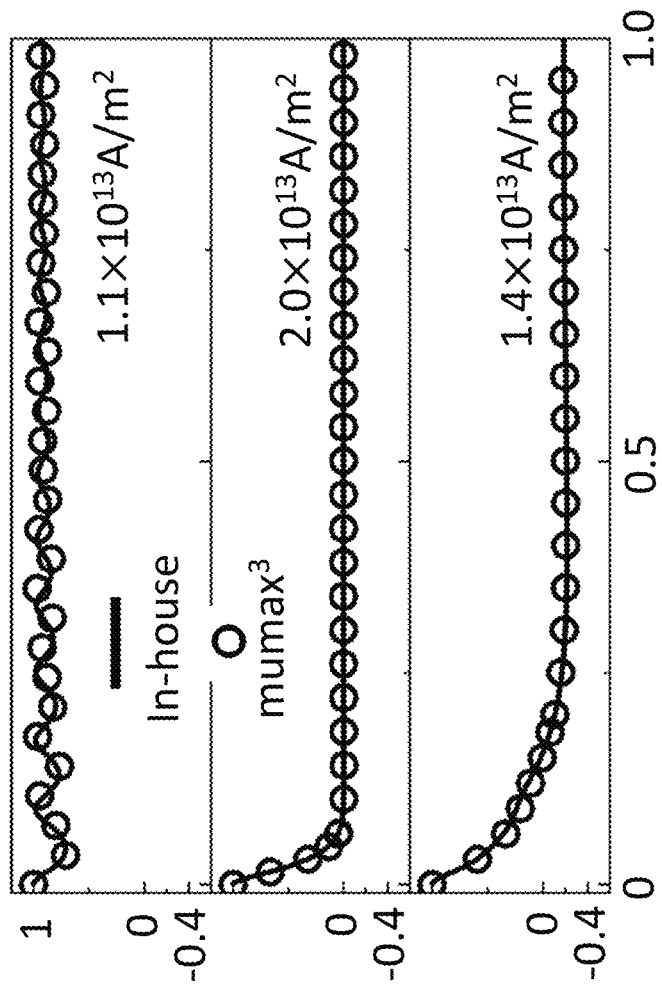
FIG. 3B shows the temporal evolution of the average perpendicular magnetization $<m_z>$ of the SOT-MRAM under a time-invariant $J_c$ of different magnitudes.
Figures 3C, 3D:
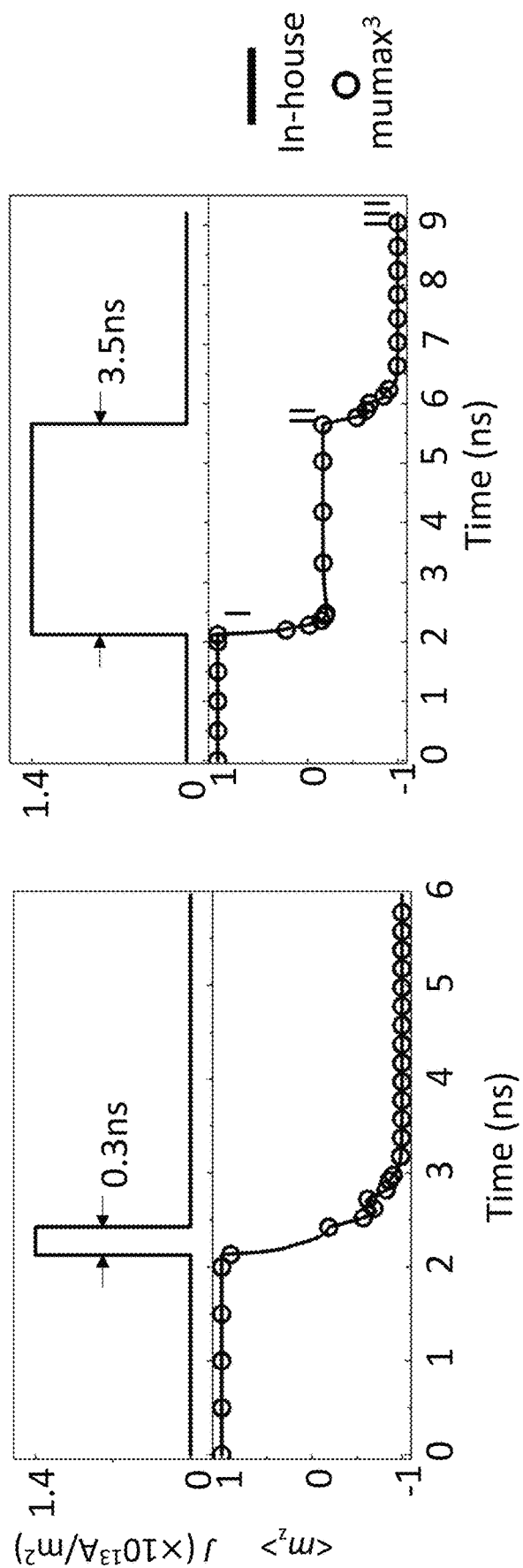
FIGS. 3C and 3D show full perpendicular reversal (where $<m_z>$ changes from 1 to −1) for the SOT-MRAM driven by a pulsed current of the same magnitude but different durations: 0.3 ns (FIG. 3C) and 3.5 ns (FIG. 3D).
Figure 3E:
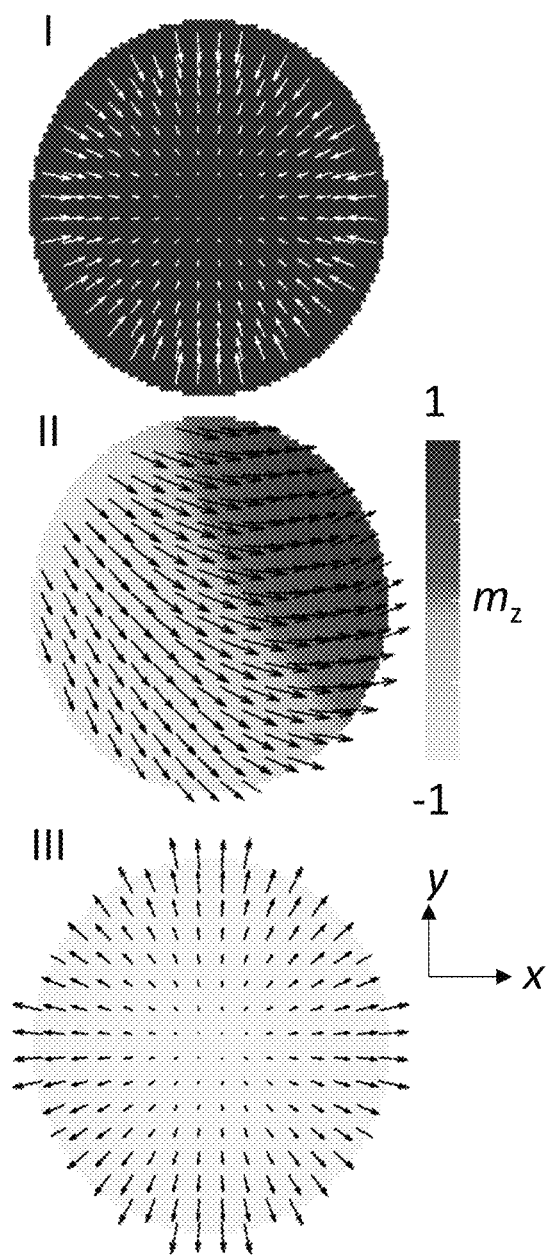
FIG. 3E depicts the top-view magnetization distributions of the $Co_{20}Fe_{60}B_{20}$ disk in the SOT-MRAM cell at stages of 2.12 ns, 5.66 ns, 9.20 ns. For clarity the arrows are shown in white in the top panel (I) and in black in the middle and lower panels (II) and (III).

A schematic diagram of the SOT-MRAM cell studied in this example is shown in FIG. 3A. The cell was composed of a 40-nm-diameter Co$_{20}$Fe$_{60}$B$_{20}$(1.7)/MgO(0.85)/Co$_{20}$Fe$_{60}$B$_{20}$(1.1) MTJ on top of a Pt (>2 nm) layer (thickness in nm). The Pt layer converts the in-plane charge current J$_c$ to an out-of-plane spin current J$_s$ via the spin-Hall effect. The DMI at the Co$_{20}$Fe$_{60}$B$_{20}$/Pt interface (shown in the right panel of FIG. 3A) induces a tilted perpendicular magnetization vector along the disk edge. The temporal evolution of the average perpendicular magnetization <m$_z$> under a time-invariant J$_c$ of different magnitudes, where the <m$_z$> equilibrates with a negative value when J$_c$ is at the intermediate value of 1.4×10$^{13}$ A/m$^2$, is shown in FIG. 3B. Full perpendicular reversal (where <m$_z$> changes from 1 to −1) driven by a pulsed current J$_c$ of the same magnitude, but different durations, is shown in FIG. 3C (0.3 ns) and FIG. 3D (3.5 ns). Two-step magnetization switching in the Co$_{20}$Fe$_{60}$B$_{20}$ free layer is clearly shown in the top-view magnetization distributions of the 1.1-nm-thick Co$_{20}$Fe$_{60}$B$_{20}$ disk at different time stages of 2.12 ns, 5.66 ns, 9.20 ns (as marked in FIG. 3D) in FIG. 3E.

Figure 4C:
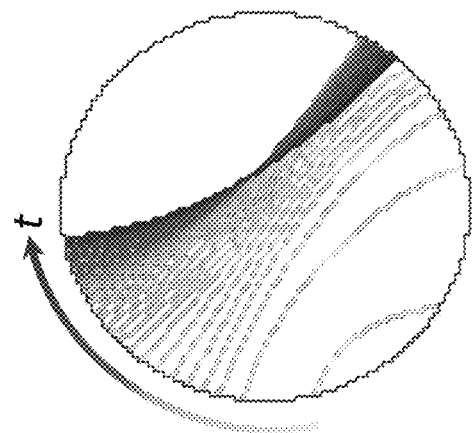
FIG. 4C is a schematic of the in-plane components of the inward tilted edge magnetization at 0 ns.
Figure 4C:
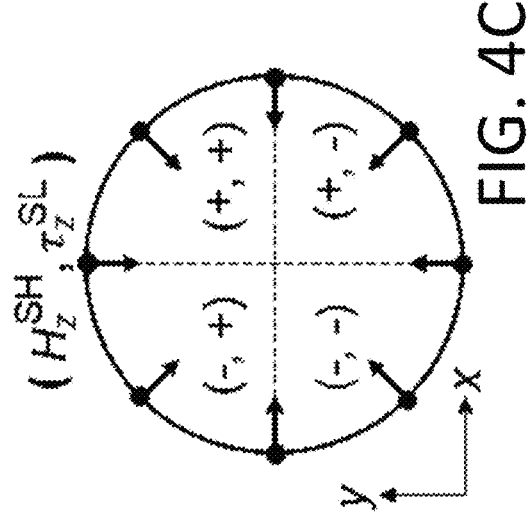
Figure 4E:
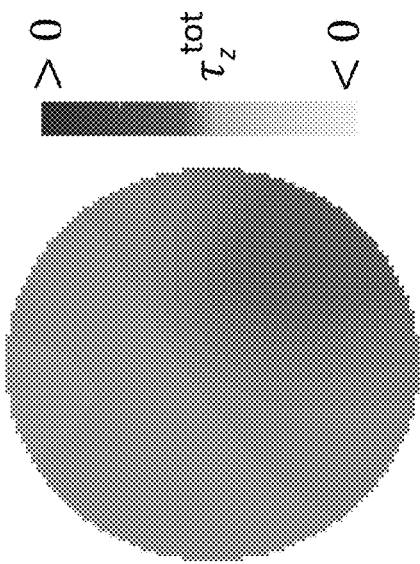
FIG. 4E depicts trajectories of domain-wall motion from the beginning of nucleation (0.06 ns) to the equilibrium (0.53) ns, plotted with a time stepping of 0.012 ns.
Figure 4D:
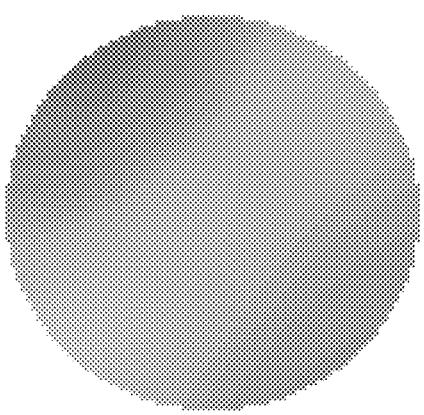
FIG. 4D depicts top-view distributions of the total torque $t_z^{tot}$ corresponding to the evolving magnetization distributions shown in FIG. 4B.
Figure 4D:
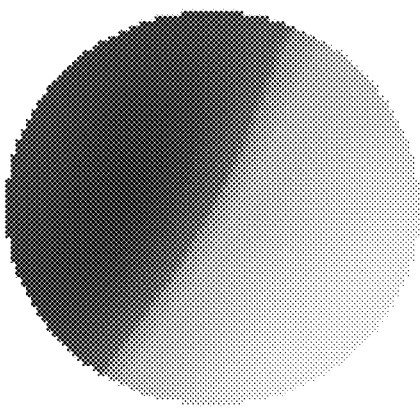

The magnetization distributions of the 1.1-nm-thick, 40-nm-diameter Co$_{20}$Fe$_{60}$B$_{20}$ disk at the initial state 0 ns (FIG. 4A) and later time stages (FIG. 4B), were also studied under a time-invariant charge current of J=1.4×10$^{13}$ A/m$^2$. FIG. 4C shows a schematic of the in-plane components of the inward tilted edge magnetization at 0 ns. The signs of the perpendicular spinHall effect effective field H$_z^{SH}$ and the perpendicular Slonczewski-type SOT torque τ$_z^{SL}$ are marked in each quadrant of the disk. The third quadrant, in which both H$_z^{SH}$ and τ$_z^{SL}$ are negative, permits the nucleation of the downward domain; see, for example, the magnetization distribution at 0.071 ns. FIG. 4D shows the top-view distributions of the total torque τ$_z^{tot}$ corresponding to the evolving magnetization distributions shown in FIG. 4B. The trajectories of domain-wall motion from the beginning of nucleation (0.06 ns) to the equilibrium (0.53 ns), plotted with a time stepping of 0.012 ns, are shown in FIG. 4E.

A map of equilibrated values of <m$_z$> as a function of the diameter of the 1.1-nm-thick Co$_{20}$Fe$_{60}$B$_{20}$ disk and the magnitude of in-plane charge current J$_c$ is provided in FIG. 5. Only negative values lower than −0.1 are shown, indicating the size and current range that permit a two-step reversal under a constant DMI strength of 0.45 mJ/m$^2$. Importantly, it can be seen from the graph of FIG. 5 that deterministic perpendicular switching is achievable at diameters in the range from 40 nm to 63 nm.

Additional simulations were carried out to assess the appropriate lateral dimensions for a Co$_{20}$Fe$_{60}$B$_{20}$ free layer in combination with other non-magnetic spin current layers, which would provide different DMI constants. DMI constants in the range from 0 to 3.4 were used. As shown in Table 2, deterministic perpendicular magnetization switching is achievable for DMI constants in the range from 0.2 mJ/m$^2$ to 3.2 mJ/m$^2$ for MTJ diameters in the range from 40 nm to 63 nm. The allowable ranges for both the lateral size of Co$_{20}$Fe$_{60}$B$_{20}$ free layer and the densities of charge current densities can vary with the DMI constant. The latter can be tuned by choosing appropriate non-magnetic underlayers from, for example, the candidate materials listed above.

TABLE 2

| D (mJ/m$^2$) | Lateral Size of CoFeB Free Layer (nm) | Current Range (×10$^{13}$ A/m$^2$) |
| --- | --- | --- |
| 0 | No Switching | No Switching |
| 0.2 | 40-63 | 1.15-1.50 |
| 0.4 | 40-63 | 1.15-1.75 |
| 0.6 | 40-60 | 1.10-1.75 |
| 0.8 | 40-60 | 1.10-1.80 |
| 1.0 | 40-60 | 1.10-1.75 |
| 1.2 | 40-60 | 1.10-1.75 |
| 1.4 | 40-50 | 1.25-1.75 |
| 1.6 | 40-50 | 1.25-1.75 |
| 1.8 | 40-50 | 1.25-1.75 |
| 2.0 | 40-50 | 1.25-1.75 |
| 2.2 | 40-47 | 1.30-1.75 |
| 2.4 | 40-45 | 1.30-1.75 |
| 2.6 | 40-45 | 1.30-1.75 |
| 2.8 | 40-43 | 1.35-1.75 |
| 3.0 | 40 | 1.45-1.80 |
| 3.2 | 40 | 1.45-1.80 |
| 3.4 and above | No Switching | No Switching |

Example 2

Field-Free Deterministic Switching in Pt/Co/MgO

This example reveals the appropriate lateral dimension ranges and charge current densities for the enablement of magnetic field-free SOT-induced perpendicular magnetization reversal based on micromagnetic simulations implemented in an in-house package and confirmed using MuMax3 software. Using realistic materials parameters from documented experimental measurements, the simulations demonstrate that deterministic perpendicular magnetization switching can occur in a MgO/Co (1.1 nm)/Pt (>2 nm) circular multilayer stack where the MgO/Co bilayer has a diameter in the range from 60 nm to 300 nm.

The parameters used in the simulations are provided in Table 3.

TABLE 3

| Parameter | Value |
|---|---|
| Saturation Magnetization ($M_S$) | $1.4 \times 10^6$ A/m |
| Anisotropy Constant ($K_1$) | $1.45 \times 10^6$ J/m$^3$ |
| Exchange Constant (A) | $2.75 \times 10^{-11}$ J/m |
| DMI Constant (D) | 2.05 mJ/m$^2$ |
| Damping constant ($\alpha$) | 0.31 |
| Simulation cell size ($\Delta x$, $\Delta y$, $\Delta z$) | (1 nm, 1 nm, 1 nm) |
| Time stepping ($\Delta t$) | $1.77 \times 10^{-14}$ s |

Figure 6A:
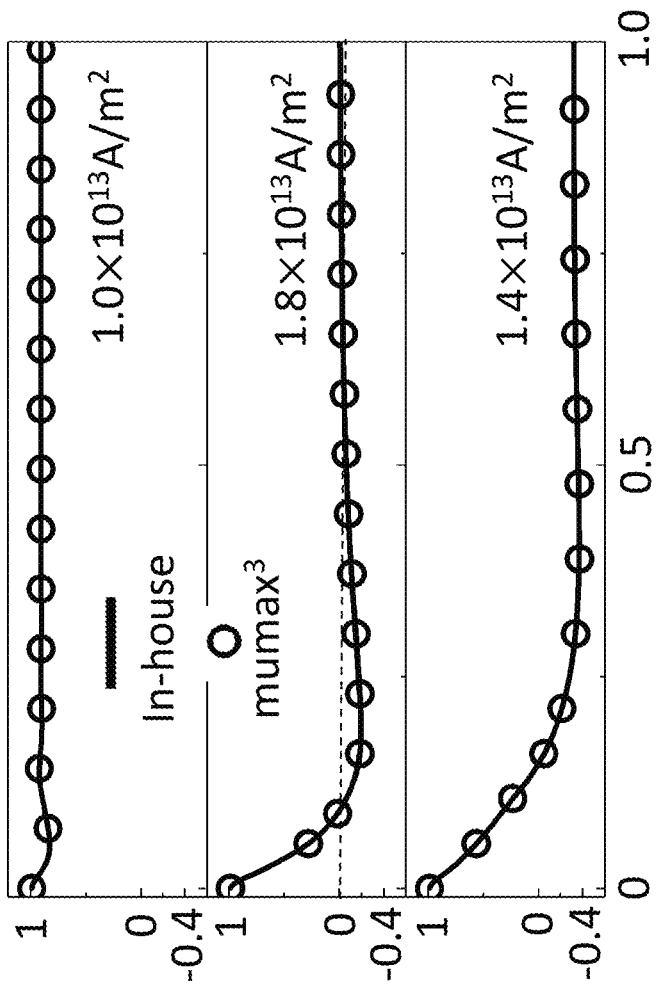
FIG. 6A shows the temporal evolution of the average perpendicular magnetization <$m_z$> of the SOT-MRAM under a time-invariant $J_c$ of different magnitudes.
Figure 6C:
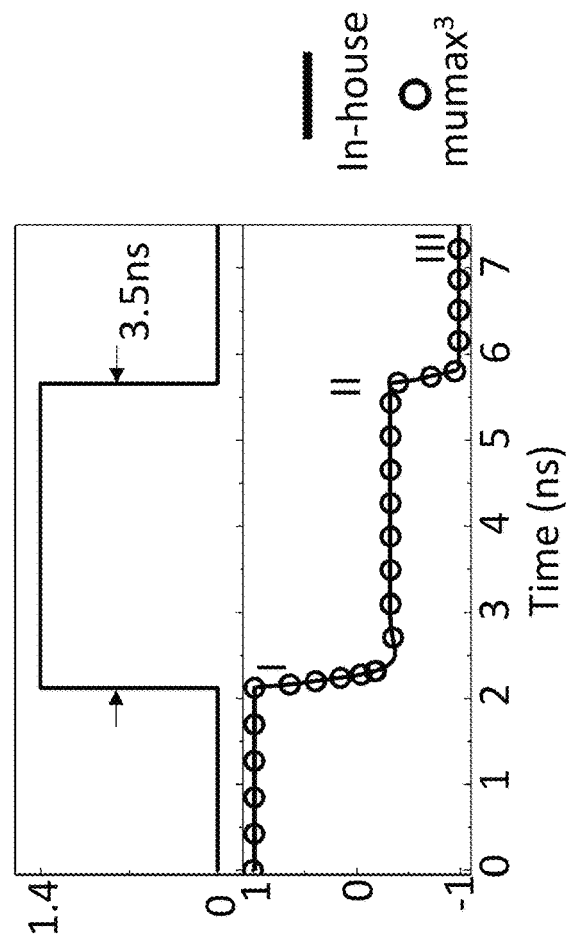
FIGS. 6B and 6C show full perpendicular reversal (where <$m_z$> changes from 1 to −1) for the SOT-MRAM driven by a pulsed current $J_c$ of the same magnitude but different durations: 0.3 ns (FIG. 6B) and 3.5 ns (FIG. 6C).
Figure 6B:
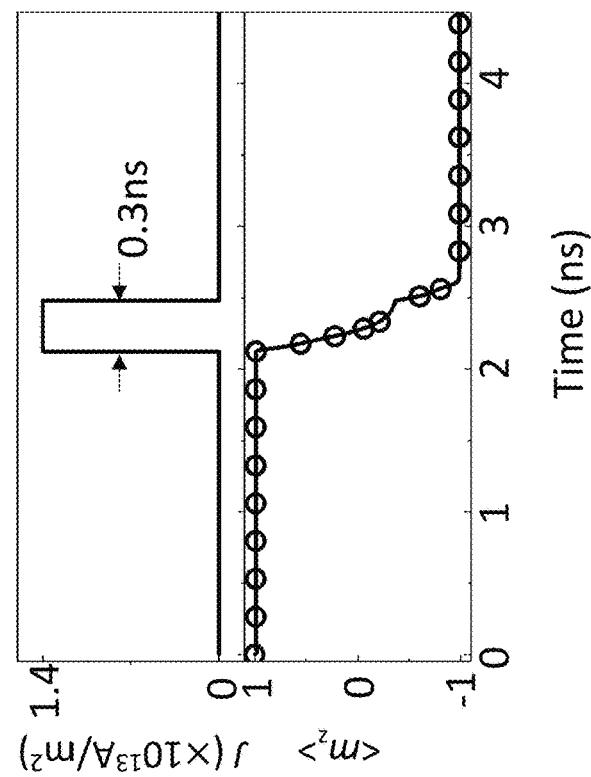
Figure 6D:
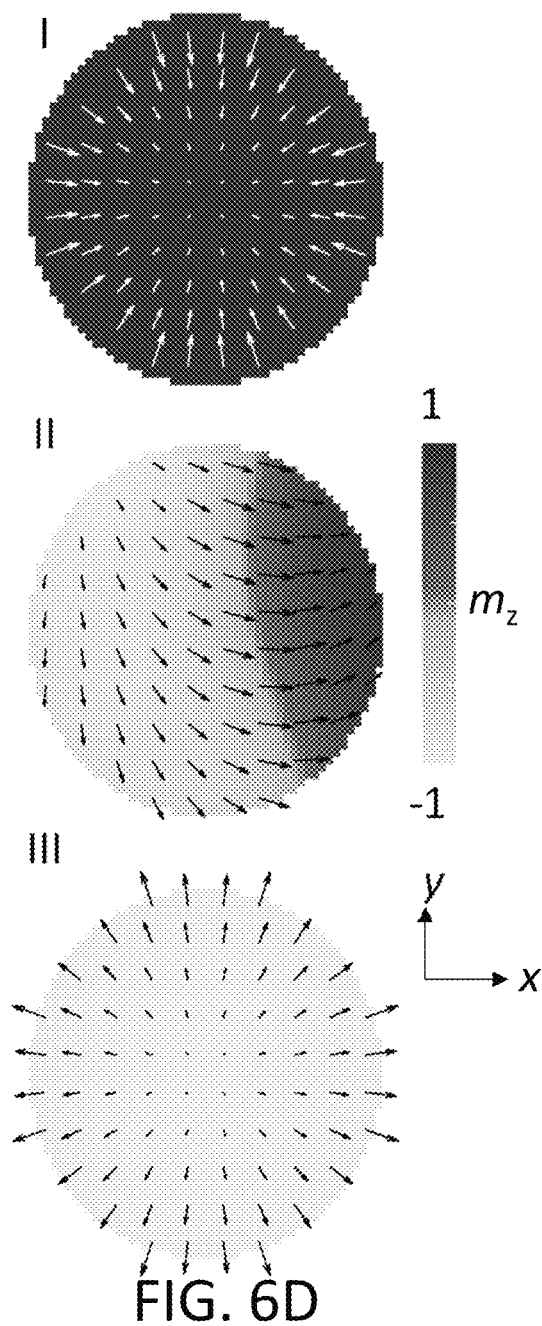
FIG. 6D depicts the top-view magnetization distributions of the Co disk in the SOT-MRAM cell at stages of 2.12 ns, 5.66 ns, 7.50 ns. For clarity the arrows are shown in white in the top panel (I) and in black in the middle and lower panels (II) and (III).

The stack structure of the SOT-MRAM cell studied in this example is the same as that shown in FIG. 3A, except that the CoFeB is replaced by 1.1-nm-thick, 50-nm-diameter cobalt. The temporal evolution of the average perpendicular magnetization $<m_z>$ under a time-invariant $J_c$ of different magnitudes, where the $<m_z>$ equilibrates with a negative value when $J_c$ is at the intermediate value of $1.4 \times 10^{13}$ A/m$^2$, is shown in FIG. 6A. Full perpendicular reversal (where $<m_z>$ changes from 1 to −1) driven by a pulsed current $J_c$ of the same magnitude, but different durations, is shown in FIG. 6B (0.3 ns) and FIG. 6C (3.5 ns). Two-step magnetization switching in the Co free layer is clearly shown in the top-view magnetization distributions of the 1.1-nm-thick Co disk at different time stages of 2.12 ns, 5.66 ns, 7.50 ns (as marked in FIG. 6C) in FIG. 6D.

Figure 7A:
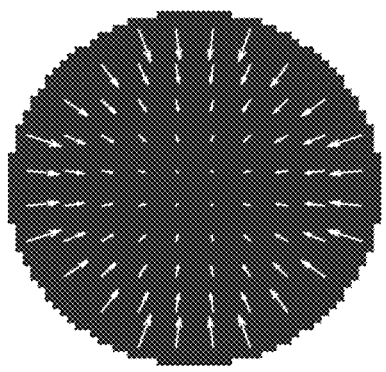
FIGS. 7A-7B depict top-view magnetization distributions of the Co disk in the SOT-MRAM cell at the initial state 0 ns (FIG. 7A) and later time stages (FIG. 7B), under a time-invariant charge current J=1.4×10¹³ A/m². For clarity, the arrows are shown in white in FIG. 7A and in black in FIG. 7B.
Figure 7B:
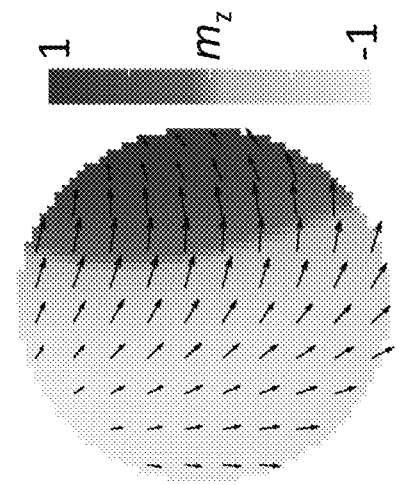
Figure 7B:
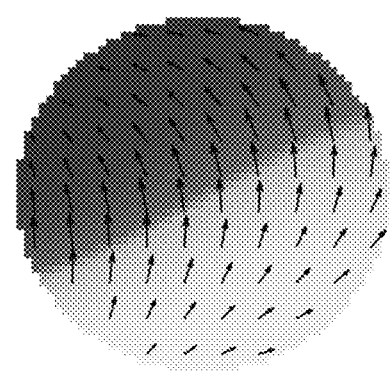
Figure 7B:
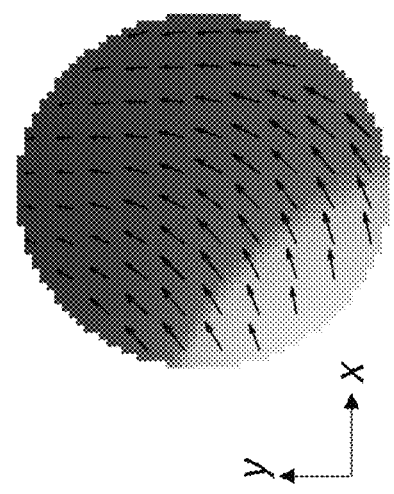

FIGS. 7A-7B depict top-view magnetization distributions of the Co disk in the SOT-MRAM cell at the initial state 0 ns (FIG. 7A) and later time stages (FIG. 7B), under a time-invariant charge current $J=1.4 \times 10^{13}$ A/m$^2$.

A map of equilibrated values of $<m_z>$ as a function of the diameter of the 1.1-nm-thick Co disk and the magnitude of in-plane charge current $J_c$ is provided in FIG. 8. Only negative values lower than −0.1 are shown, indicating the size and current range that permit a two-step reversal under a constant DMI strength of 2.05 mJ/m$^2$. Importantly, it can be seen from the graph of FIG. 8 that deterministic perpendicular switching is achievable at charge current densities in the range from 45 nm to 75 nm.

Example 3 (Prophetic)

Field-Free Deterministic Switching in Pt/CoFe/MgO and Pt/Fe/MgO

The micromagnetic simulations described in Examples 1 and 2 can be carried out using CoFe or Fe as the free layer, rather than CoFeB or Co. A comparison of the relevant simulation parameters is provided in Table 4.

TABLE 4

| Parameter | CoFeB | Co | Fe$_{80}$Co$_{20}$ (0.55 nm) | Fe (0.48-nm-thick) |
|---|---|---|---|---|
| Saturation Magnetization ($M_S$); Unit: A/m | $1.21 \times 10^6$ | $1.4 \times 10^6$ | $1.15 \times 10^6$ | $1.5 \times 10^6$ |
| Anisotropy Constant ($K_1$); Unit: J/m$^3$ | $1.18 \times 10^6$ | $1.45 \times 10^6$ | $1.18 \times 10^6$ | $1.21 \times 10^6$ |
| Exchange Constant (A); Unit: J/m | $1.9 \times 10^{-11}$ | $2.75 \times 10^{-11}$ | $3 \times 10^{-11}$ | $1.98 \times 10^{-11}$ |
| Damping constant ($\alpha$) | 0.027 | 0.31 | 0.01 | 0.025 |

The DMI will depend on the choice of material for the pinned layer. Thus, suitable DMIs can be attained, including those in the range from 0.4 to 2.1 using, for example, various heavy metals. The similarities in the relevant parameters indicate that spin-orbit torque magnetoresistive random-access memory cells having free layer diameters and write current densities comparable to those of CoFeB and Co, as described above, can be constructed using CoFe and Fe.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A field free method of deterministically switching a spin-orbit torque magnetoresistive random-access memory cell, the memory cell comprising:
   a structurally symmetric circular magnetic tunnel junction comprising:
   a free layer comprising CoFeB, CoFe, metallic cobalt, or metallic iron and having a perpendicular direction of magnetization;
   a pinned layer comprising a ferromagnetic material having a fixed perpendicular direction of magnetization; and
   a barrier layer comprising an electrically insulating material separating the free layer from the pinned layer;
   a structurally symmetric spin current layer comprising a non-magnetic material in contact with the free layer at an interface, wherein the spin current layer is not interfaced with a strain-inducing layer; and
   a write line in electrical communication with the spin current layer; and
   a read line in electrical communication with the magnetic tunnel junction,
   the method comprising:
   passing an in-plane write current through the spin current layer in the absence of a colinear in-plane magnetic field, whereby an out-of-plane spin current running parallel with the direction of magnetization of the free layer is generated in the spin current layer, giving rise to a spin torque in the free layer that deterministically fully reverses the perpendicular direction of magnetization of the free layer, wherein the reversal of the perpendicular direction of magnetization is not strain-mediated; and passing a read current through the magnetic tunnel junction and measuring the resistance of the magnetic tunnel junction.

2. The method of claim 1, wherein the free layer comprises CoFeB and has a diameter in the range from 40 nm to 63 nm, and the write current density is less than $1.75 \times 10^{13}$ A/m$^2$.

3. The method of claim 2, wherein the free layer has a diameter of less than 60 nm.

4. The method of claim 2, wherein the write current density is in the range from $1.75 \times 10^{13}$ A/m$^2$ to $1.10 \times 10^{13}$ A/m$^2$.

5. The method of claim 2, wherein the spin current layer comprises platinum.

6. The method of claim 5, wherein the free layer comprises metallic cobalt and has a diameter in the range from 45 nm to 75 nm, and the write current density is less than $1.60 \times 10^{13}$ A/m$^2$.

7. The method of claim 6, wherein the write current density is in the range from $1.60 \times 10^{13}$ A/m$^2$ to $1.00 \times 10^{13}$ A/m$^2$.

8. The method of claim 6, wherein the spin current layer comprises platinum.

9. The method of claim 1, wherein the free layer comprises metallic cobalt and has a diameter of in the range from 45 nm to 75 nm, and the write current density is less than $1.60 \times 10^{13}$ A/m$^2$.

10. The method of claim 9, wherein the write current density is in the range from $1.60 \times 10^{13}$ A/m$^2$ to $1.00 \times 10^{13}$ A/m$^2$.

11. The method of claim 9, wherein the spin current layer comprises platinum.

12. The method of claim 1, wherein the free layer comprises CoFe.

13. The method of claim 12, wherein the spin current layer comprises platinum.

14. The method of claim 1, wherein the free layer comprises metallic iron.

15. The method of claim 14, wherein the spin current layer comprises platinum.

16. A spin-orbit torque magnetic random-access memory cell comprising:

a structurally symmetric circular magnetic tunnel junction comprising:

a free layer comprising CoFeB, CoFe, metallic cobalt, or metallic iron and having a perpendicular magnetic anisotropy, the free layer having a diameter in the size range from 35 nm to 80 nm;

a pinned layer comprising a ferromagnetic material having a fixed perpendicular direction of magnetization; and a barrier layer comprising an electrically insulating material separating the free layer from the pinned layer; and a structurally symmetric spin current layer comprising a non-magnetic material in contact with the free layer at an interface, wherein the Dyzaloshinskii-Moriya interaction at the interface is in the range from 0.2 mJ/m$^2$ to 3.2 mJ/m$^2$.

17. The cell of claim 16, further comprising:

a write line in electrical communication with the spin current layer; and a read line in electrical communication with the magnetic tunnel junction.

18. The cell of claim 16, wherein the free layer comprises CoFeB and has a diameter in the range from 40 nm to 63 nm.

19. The cell of claim 18, wherein the free layer has a diameter of less than 60 nm.

20. The cell of claim 16, wherein the free layer comprises metallic cobalt and has a diameter in the size range from 45 nm to 75 nm.

21. The cell of claim 16, wherein the free layer comprises CoFe.

22. The cell of claim 16, wherein the free layer comprises metallic iron.

23. The method of claim 1, wherein the free layer has a diameter in the size range from 35 nm to 80 nm and the Dyzaloshinskii-Moriya interaction at the interface is in the range from 0.2 mJ/m$^2$ to 3.2 mJ/m$^2$.

24. The method of claim 23, wherein the Dyzaloshinskii-Moriya interaction at the interface is in the range from 0.4 to 2.1 mJ/m$^2$.

25. The cell of claim 16, wherein the Dyzaloshinskii-Moriya interaction at the interface is in the range from 0.4 mJ/m$^2$ to 2.1 mJ/m$^2$.

* * * * *